United States Patent [19]
Ho

[11] Patent Number: 5,225,357
[45] Date of Patent: Jul. 6, 1993

[54] LOW P+ CONTACT RESISTANCE FORMATION BY DOUBLE IMPLANT

[75] Inventor: Bernard W. K. Ho, Fremont, Calif.

[73] Assignee: Chartered Semiconductor Manufacturing, Singapore, Singapore

[21] Appl. No.: 815,515

[22] Filed: Jan. 2, 1992

[51] Int. Cl.⁵ .......................................... H01L 21/265
[52] U.S. Cl. ........................................ 432/30; 437/44; 437/950; 257/24
[58] Field of Search ...................... 437/30; 432/29, 44; 148/DIG. 53; 257/24

[56] References Cited

U.S. PATENT DOCUMENTS

| | | | |
|---|---|---|---|
| 4,649,629 | 3/1987 | Miller et al. | 29/571 |
| 4,764,478 | 8/1988 | Hiruta | 437/29 |
| 4,786,609 | 11/1988 | Chen | 437/30 |
| 4,994,404 | 2/1991 | Sheng et al. | 437/30 |
| 5,073,514 | 12/1991 | Ito et al. | 437/29 |
| 5,089,432 | 2/1992 | Yoo | 437/34 |
| 5,091,763 | 2/1992 | Sanchez | 437/29 |

OTHER PUBLICATIONS

Sze in VLSI Technology, McGraw-Hill Co., N.Y. 1988, pp. 350, 362 and 363.
IBM Technical Disclosure Bulletin, vol. 29, No. 7, Dec. 1986, p. 3132.

Primary Examiner—Olik Chaudhuri
Assistant Examiner—Long Pham
Attorney, Agent, or Firm—George O. Saile

[57] ABSTRACT

The method of manufacture of a PMOS integrated circuit having a feature size in the order of one micron or less is done by providing, on a silicon substrate, a pattern of silicon gate electrodes over a gate dielectric. Implanting of $BF_2+$ ions and $B11+$ ions sequentially by using the pattern as a mask. The structure is annealed at more than about 850° C. to complete the PMOS integrated circuit. This method results in lower contact resistance to the P+ regions and lower sheet resistance for higher speed CMOS integrated circuits at minimal increase of manufacturing cost.

20 Claims, 2 Drawing Sheets

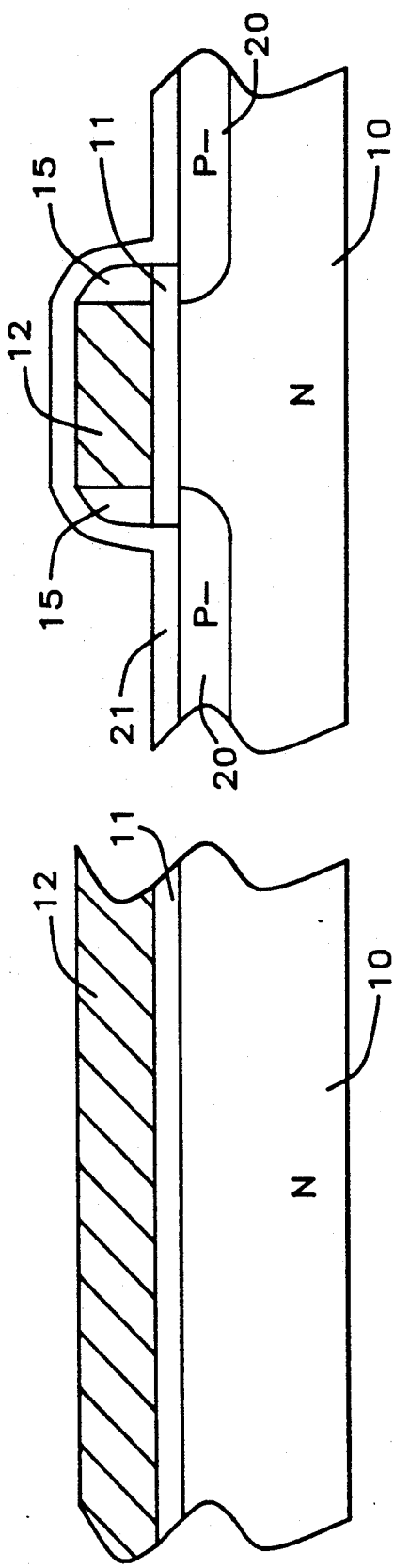
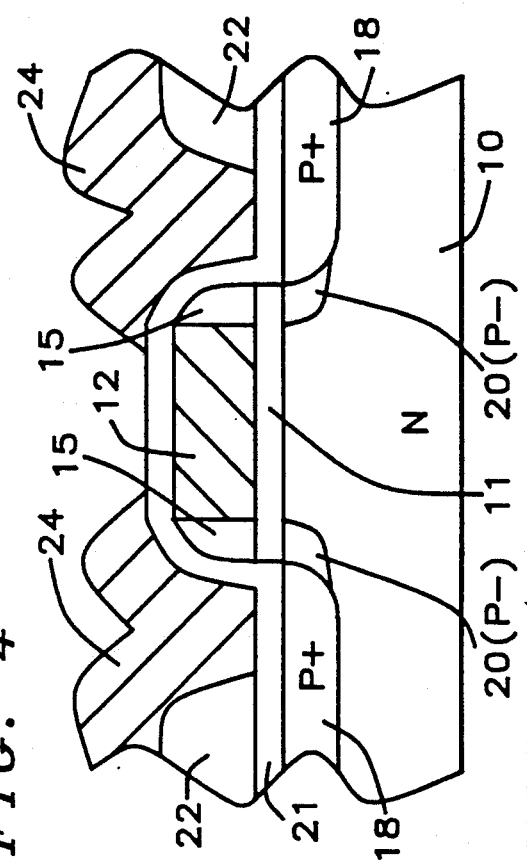
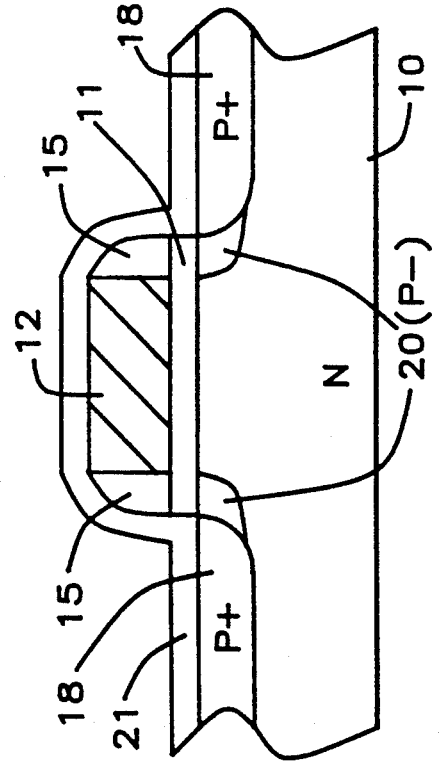
FIG. 3
FIG. 4
FIG. 5
FIG. 6

LOW P+ CONTACT RESISTANCE FORMATION BY DOUBLE IMPLANT

BACKGROUND OF THE INVENTION (1) Field of the Invention

This invention relates to the fabrication of integrated circuit devices and more particularly to a method of providing low contact resistance.

(2) Description of the Prior Art

In the existing process, either B or BF2 is used as an ion implantation source. Both of these ions have drawbacks. B+ implantation penetrates deeply and can cause a channel short after annealing where the channel is of very short length. BF2 implantation provides a shallow junction, but can cause heavy implant damage that is difficult to anneal out for low contact resistance. Sze in VLSI TECHNOLOGY published by McGraw-Hill Co. New York, N.Y. 1988 pages 350, 362 and 363 consider the advantages and problems of implantation of boron sources. Both boron ion species have been used separately for ion implantation, for example in U.S. Pat. No. 4,649,629 (Thomson-Mostek) and U.S. Pat. No. 4,764,478 (Toshiba).

SUMMARY OF THE INVENTION

A principal object of the invention is to provide an effective and very manufacturable method to fabricate a PMOS integrated circuit wherein the metal to P+ doped silicon contact resistance is lowered while maintaining a shallow junction.

Another object of the invention is to provide an effective and very manufacturable method to fabricate a PMOS integrated circuit wherein the manufacturing cost is controlled because no additional masking step is required.

In accordance with these objects of this invention, a new method of ion implantation is achieved. The method involves implanting $BF_2$ ions using as a mask a suitable pattern of silicon gate electrodes over gate dielectric. A second implantation of B11 ions is made using the same mask. The resulting structure is annealed between about 850° to 950° C. to form the PMOS integrated circuit.

BRIEF DESCRIPTION OF THE DRAWINGS

In the accompanying drawings forming a material part of this description, there is shown:

FIGS. 3, 4, 5, and 6 schematically illustrate in cross-sectional representation one preferred embodiment of this invention.

DESCRIPTION OF THE PREFERRED EMBODIMENTS

Figure 1A:
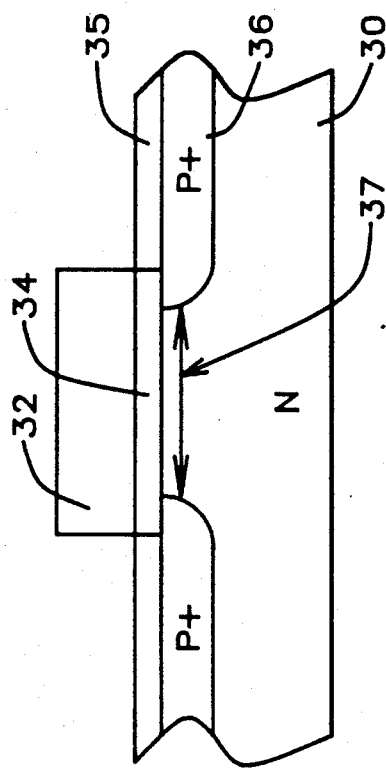
FIGS. 1A, 1B, 2A, and 2B schematically illustrate in cross-sectional representation the Prior Art of boron or $BF_2$ ion implantation.
Figure 1B:
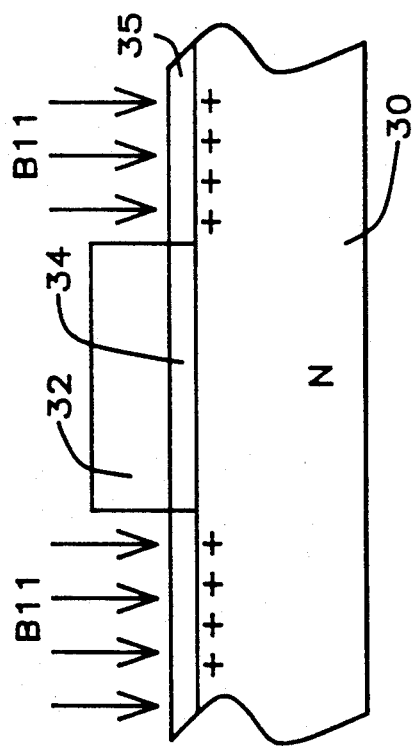

Referring now more particularly to FIG. 1A, there is illustrated a partially completed PMOS structure in which there is a monocrystalline semiconductor substrate 30 which is N doped. The surface of the silicon substrate 30 is thermally oxidized to form the desired gate silicon oxide thickness 34. The polysilicon layer 32 is blanket deposited and rendered conductive by ion implantation or diffusion as is conventional in the art to form a gate electrode. A silicon oxide layer 35 is formed of a desired thickness for the subsequent ion implantation purpose. Boron (B11) ions are implanted to form the P+ source structures 36 shown in FIG. 1B. This results in deep junctions and can result in a channel short 37 after annealing where the channel is narrow.

Figure 2A:
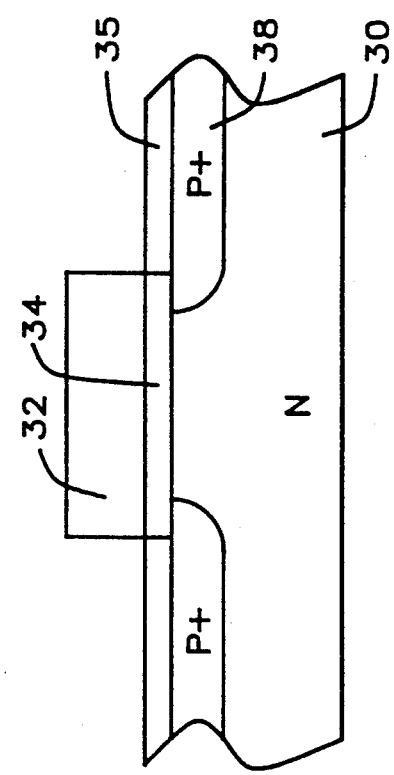
Figure 2B:
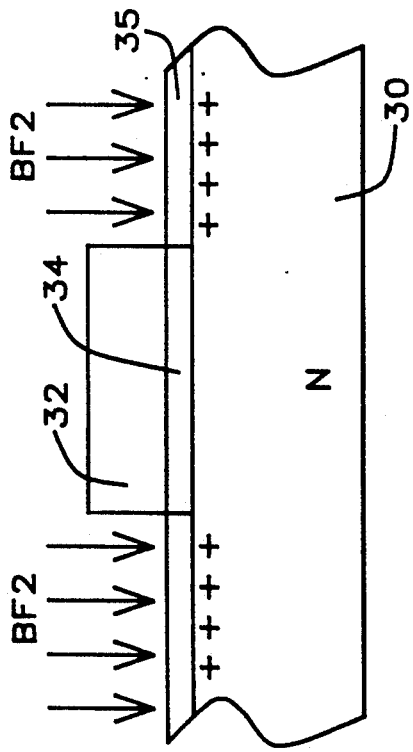

Similarly, FIG. 2A illustrates a partially completed PMOS structure in which there is shown a monocrystalline silicon Substrate 30, gate oxide 34, and gate electrode 32. A silicon oxide layer 35 is formed of a desired thickness for the subsequent ion implantation purpose. $BF_2$ ions are implanted to form the P+ source structures 38 shown in FIG. 2B. This results in desirable shallow junctions, but can cause heavy implant damage that cannot be annealed out easily.

Referring now to FIG. 3, there is illustrated a partially completed PMOS structure in which there is an N doped monocrystalline silicon semiconductor substrate 10. The surface of the silicon substrate 10 is thermally oxidized to form the desired gate oxide 11 thickness. The preferred thickness is between 200 and 250 Angstroms. The polysilicon layer 12 is formed by chemical vapor deposition using silane at conditions of 630° to 670° C. The preferred thickness of the polysilicon layer 12 is between about 3000 to 4000 Angstroms. The polysilicon layer 12 is doped with phosphorus by the conventional gaseous phosphorus oxychloride diffusion process at about 850° to 950° C.

Referring now to FIG. 4, the polysilicon layer 12 is patterned by conventional lithography and anisotropic etching techniques as are conventional in the art to provide a desired gate electrode as shown.

The source/drain structure of the PMOS FET may now be formed by the following steps. FIG. 5 illustrates the formation of a P channel FET integrated circuit device. However, it is well understood by those skilled in the art that a CMOS FET could be formed in a similar way by making both N and P channel devices upon the same substrate.

FIG. 4, for example shows the ion implantations of P− dopants. Lithographic masks may be required to protect the areas not to be subjected to that particular P− ion implantation. The formation of the lithographic masks are done by conventional lithography and etching techniques. The P− lightly doped drain implantation 20 is done with, for example boron difluoride, $BF_2$ at a dose of between about 2 E 13 to 5 E 13 atoms/cm.$^2$ and with an energy of between about 40 to 60 Kev.

The dielectric spacer 15 is now to be formed followed by the completion of the lightly doped drain source/drain structures. A low temperature silicon oxide deposition is preferred such as through the chemical vapor deposition of tetraethoxysilane (TEOS) at a temperature in the range of between about 300° to 400° C. Other silicon oxide deposition methods include silane based LPCVD. The thickness of the dielectric silicon dioxide layer 15 is between about 1500 to 2500 Angstroms and preferably about 1800 to 2200 Angstroms.

An anisotropic etching of this layer produces the dielectric spacer layer 15 on the sidewalls of the layer structures 11, 12. The anisotropic etching uses a conventional reactive ion etching ambient.

The critical P+ source/drain ion implantation of the invention uses a combination of two successive P type boron implantations. First, those areas not to be subjected to P+ ion implantation are protected with lithographic block out masks formed by conventional techniques. Then, preferably $BF_2+$ ions are implanted into the areas desired to have source/drain implantations under the conditions of between about 1 to 2 E 15 dosage atoms per cm² and energy of between about 40 to 60 KEV and preferably about 50 KEV. Next, B11+ ions are implanted under the conditions of between about 1 E 15 to 4 E 15 and preferably about 3 E 15 dosage atoms per cm2 and energy of between about 30 to 40 Kev and preferably about 35 KEV. Finally, the integrated circuit is annealed at between 850° and 950° C. and under the conditions and ambient of either pure nitrogen or dry oxygen. The ion implantation steps of BF₂+ and B11+ can be reversed, but it is preferred to ion implant the BF₂+ first. The before mentioned annealing step can be used after each ion implant step or preferably after both ion implant steps due to cost considerations.

To achieve low P+ contact resistance, the combined BF₂+ and B11+ dose should be between 2 to 5 E 15 atoms per cm2. The order in which the BF₂+ and B11+ ions are implanted is not critical. However, reduced short channel effect results from BF₂+ being implanted first. To further reduce short channel effects, B11+ implant energy should be kept low, not to exceed about 40 KEV. The annealing process following the double implanting steps is critical to achieve low P+ contact, while avoiding short channel effects. A 30 minute at 850° to 950° C. or rapid thermal annealing process of less than one minute at 1000° C. for the critical annealing process will suffice. The choice of sidewall silicon oxide 15 thickness is important for the optimization of N and P channel transistor performance and bit carrier reliability. The preferred thickness for this silicon oxide layer 15 is between about 1500 to 2500 Angstroms.

The next series of steps are to complete the P channel device. As shown in FIG. 6, an insulating layer 22 is deposited over the gate electrode 12. The insulating layer 22 may be composed of a layer of silicon oxide and borophosphosilicate glass (BPSG) and have a total thickness of preferably between about 5000 to 8000. The contact windows or openings are formed through the insulating layer to the source/drain regions 18. This is done by conventional lithography and etching techniques.

Metal layers 24 are deposited above and on the sides of the contact openings. This metal layer may be deposited by conventional sputtering processes. This metal layer may consist of aluminum, aluminum/copper/silicon with or without a barrier layer of titanium/tungsten or titanium/titanium-nitride. The layer 24 has a preferred thickness of between about 4000 to 6000 Angstroms. The metal layer 24 is patterned by conventional lithography and etching techniques to complete the FIG. 6.

The process of the invention results in lower contact resistance to the P+ regions and lower sheet resistance for higher speed CMOS integrated circuits at minimal increase of manufacturing cost.

While the invention has been particularly shown and described with reference to the preferred embodiments thereof, it will be understood by those skilled in the art that various changes in form and details may be made without departing from the spirit and scope of the invention.

What is claimed is:

1. The method of manufacture of a PMOS integrated circuit comprising:
   (a) providing, on a silicon substrate, a pattern of silicon gate electrodes over a gate dielectric;
   (b) forming a heavily doped drain by
   (1) implanting BF₂+ ions using said pattern as a mask;
   (2) implanting B11+ ions using said pattern as a mask; and
   (c) annealing at between about 850° to 950° C. to form said PMOS integrated circuit.

2. The method of claim 1 wherein energy of said BF₂+ ion implanting is between about 40 to 60 KEV and energy of said B11+ ion implanting is less than about 40 KEV.

3. The method of claim 1 wherein the dosage of said BF₂+ ion implanting is between about 1 to 2 E 15 atoms per cm² and the dosage of said B11+ ion implanting is between about 1 to 4 E 15 atoms per cm².

4. The method of claim 1 wherein the total dosage of the two boron ion implanting species is between about 2 to 5 E 15 atoms per cm².

5. The method of claim 1 and further comprising forming a sidewall insulator structure upon the sidewalls of said gate dielectric and gate electrodes pattern after ion implanting said BF₂+ into said substrate.

6. The method of claim 5 wherein said sidewall insulator is composed of silicon oxide and has a thickness of between about 1500 to 2500 Angstroms.

7. The method of manufacture of a PMOS integrated circuit having a feature size in the order of one micron or less comprising:
   (a) providing, on a silicon substrate, a pattern of silicon gate electrodes over a gate dielectric;
   (b) forming a heavily doped drain region by sequentially implanting BF₂+ ions and B11+ ions using said pattern as a mask; and
   (c) annealing at more than about 850° C. to form said PMOS integrated circuit.

8. The method of claim 7 wherein said order of said sequentially implanting is to implant the BF₂+ ions first and the B11+ ions second.

9. The method of claim 7 wherein said order of said sequentially implanting is to implant the B11+ ions first and the BF₂+ ions second.

10. The method of claim 7 wherein said annealing is by furnace anneal between about 850° to 950° C. for more than about 30 minutes.

11. The method of claim 7 wherein said annealing is by rapid thermal anneal at a temperature more than about 1000° C.

12. The method of claim 7 wherein energy of said BF₂+ ion implanting is between about 40 to 60 KEV and energy of said B11+ ion implanting is less than about 40 KEV.

13. The method of claim 7 wherein the dosage of said BF₂+ ion implanting is between about 1 to 2 E 15 atoms per cm² and the dosage of said B11+ ion implanting is between about 1 to 4 E 15 atoms per cm².

14. The method of claim 7 wherein the total dosage of the two boron ion implanting species is between about 2 to 5 E 15 atoms per cm².

15. The method of claim 8 and further comprising forming a sidewall insulator structure upon the sidewalls of said gate dielectric and gate electrodes pattern after ion implanting said BF₂+ into said substrate.

16. The method of claim 15 wherein said sidewall insulator is composed of silicon oxide and has a thickness of between about 1500 to 2500 Angstroms.

17. The method of manufacture of an lightly doped drain PMOS integrated circuit having a feature size in the order of one micron or less comprising:

(a) providing, on a silicon substrate, a pattern of silicon gate electrodes over a gate dielectric;
(b) forming a lightly doped drain boron doped region in said substrate beneath and adjacent to said gate electrodes;
(c) forming heavily doped drain regions by sequentially implanting $BF_2+$ ions and $B11+$ ions using said pattern as a mask which results in the total of said ions being the desired dopant for the heavily doped drain regions; and
(d) annealing at more than about 850° C. to form said PMOS integrated circuit.

18. The method of claim 17 wherein energy of said $BF_2+$ ion implanting is between about 40 to 60 KEV and energy of said $B11+$ ion implanting is less than about 40 KEV.

19. The method of claim 17 wherein the dosage of said $BF_2+$ ion implanting is between about 1 to 2 E 15 atoms per $cm^2$ and the dosage of said $B11+$ ion implanting is between about 1 to 4 E 15 atoms per $cm^2$.

20. The method of claim 17 wherein the total dosage of the two boron ion implanting species is between about 2 to 5 E 15 atoms per $cm^2$.

* * * * *